United States Patent
Xu et al.

(10) Patent No.: US 9,472,475 B2
(45) Date of Patent: Oct. 18, 2016

(54) FEEDBACK CONTROL USING DETECTION OF CLEARANCE AND ADJUSTMENT FOR UNIFORM TOPOGRAPHY

(71) Applicant: Applied Materials, Inc., Santa Clara, CA (US)

(72) Inventors: Kun Xu, Sunol, CA (US); Ingemar Carlsson, Milpitas, CA (US); Tzu-Yu Liu, San Jose, CA (US); Shih-Haur Shen, Sunnyvale, CA (US); Boguslaw A. Swedek, Cupertino, CA (US); Wen-Chiang Tu, Mountain View, CA (US); Lakshmanan Karuppiah, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 444 days.

(21) Appl. No.: 13/774,843

(22) Filed: Feb. 22, 2013

(65) Prior Publication Data

US 2013/0224890 A1 Aug. 29, 2013

Related U.S. Application Data

(60) Provisional application No. 61/603,835, filed on Feb. 27, 2012.

(51) Int. Cl.
 *H01L 21/66* (2006.01)
 *B24B 37/005* (2012.01)
 (Continued)

(52) U.S. Cl.
 CPC ............. *H01L 22/26* (2013.01); *B24B 37/005* (2013.01); *B24B 37/04* (2013.01); *B24B 49/12* (2013.01); *H01L 22/12* (2013.01)

(58) Field of Classification Search
 CPC . H01L 22/12; H01L 22/20; H01L 21/67242; H01L 21/67248; B24B 37/005; B24B 37/015; B24B 49/00; B24B 49/04; B24B 49/045; B24B 49/05; B24B 49/06; B24B 49/08; B24B 49/10; B24B 49/105; B24B 49/12; B24B 49/14; B24B 49/16
 See application file for complete search history.

(56) References Cited

U.S. PATENT DOCUMENTS

| | | | |
|---|---|---|---|
| 7,024,268 B1 * | 4/2006 | Bennett | G05B 19/41875 438/692 |
| 7,101,799 B2 | 9/2006 | Paik | |

(Continued)

OTHER PUBLICATIONS

International Search Report and Written Opinion in International Application No. PCT/US2013/027448, mailed Jul. 9, 2013, 14 pages.

*Primary Examiner* — Julio J Maldonado
*Assistant Examiner* — Stanetta Isaac
(74) *Attorney, Agent, or Firm* — Fish & Richardson P.C.

(57) ABSTRACT

A method of controlling polishing includes storing a desired ratio representing a ratio for a clearance time of a first zone of a substrate to a clearance time of a second zone of the substrate. During polishing of a first substrate, an overlying layer is monitored, a sequence of measurements is generated, and the measurements are sorted a first group associated with the first zone of the substrate and a second group associated with the second zone on the substrate. A first time and a second time at which the overlying layer is cleared is determined based on the measurements from the first group and the second group, respectively. At least one adjusted polishing pressure is calculated for the first zone based on a first pressure applied in the first zone during polishing the first substrate, the first time, the second time, and the desired ratio.

19 Claims, 8 Drawing Sheets

(51) Int. Cl.
  *B24B 37/04* (2012.01)
  *B24B 49/12* (2006.01)

(56) References Cited

U.S. PATENT DOCUMENTS

| | | |
|---|---|---|
| 7,160,739 B2 | 1/2007 | Shanmugasundram et al. |
| 7,247,080 B1 | 7/2007 | Bennett et al. |
| 7,513,818 B2 | 4/2009 | Miller et al. |
| 2007/0224915 A1 | 9/2007 | David et al. |
| 2008/0138988 A1 | 6/2008 | David et al. |
| 2010/0185314 A1* | 7/2010 | Xu ............... B24B 37/005 700/109 |
| 2010/0190339 A1* | 7/2010 | Chen et al. ............... 438/693 |
| 2011/0281501 A1 | 11/2011 | Qian et al. |
| 2012/0064801 A1 | 3/2012 | Xu et al. |

* cited by examiner

FEEDBACK CONTROL USING DETECTION OF CLEARANCE AND ADJUSTMENT FOR UNIFORM TOPOGRAPHY

CROSS-REFERENCE TO RELATED APPLICATIONS

This application claims priority to U.S. Provisional Patent Application Ser. No. 61/603,835, filed Feb. 27, 2012, the entire disclosure of which is incorporated by reference.

TECHNICAL FIELD

This disclosure relates to using monitoring to control polishing.

BACKGROUND

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. An abrasive polishing slurry is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry distribution, the polishing pad condition, the relative speed between the polishing pad and the substrate, and the load on the substrate can cause variations in the material removal rate. These variations, as well as variations in the initial thickness of the substrate layer, cause variations in the time needed to reach the polishing endpoint. Therefore, the polishing endpoint usually cannot be determined merely as a function of polishing time.

In some systems, a substrate is optically monitored in-situ during polishing, e.g., through a window in the polishing pad. However, existing optical monitoring techniques may not satisfy increasing demands of semiconductor device manufacturers.

SUMMARY

Optical monitoring can usually detect clearance of the overlying layer. A technique to improve uniformity in the time that at which an overlying layer is cleared (also termed the "clearing time") from different regions of the substrate is to detect clearance of the overlying layer for different regions of a first substrate, and adjust at least one polishing pressure on a subsequent second substrate based on the times that clearance was detected in the first substrate. However, an unexpected problem is that even when different regions of a substrate are cleared at the same time, there can still be significant differences in the amount of dishing and erosion across the substrate.

A technique to counteract this problem is to deliberately introduce differences in clearance time across the substrate to compensate for the differences in topology, but still used the detection of clearance time to adjust at least one polishing pressure on a subsequent second substrate.

In one aspect, a method of controlling polishing include storing a desired ratio, the desired ratio representing a ratio for a clearance time of a first zone of a substrate to a clearance time of a second zone of the substrate, polishing a first substrate having an overlying layer on an underlying layer or layer structure, during polishing, monitoring the overlying layer with an in-situ monitoring system and generating a sequence of measurements from the in-situ monitoring system, sorting the measurements a first group associated with the first zone of the substrate and a second group associated with the second zone on the substrate, determining a first time at which the overlying layer is cleared based on the measurements from the first group, determining a second time at which the overlying layer is cleared from the second zone on the substrate based on the measurements from the second group, calculating at least one adjusted polishing pressure for the first zone based on a first pressure applied in the first zone during polishing the first substrate, the first time, the second time, and the desired ratio, and polishing a second substrate using the at least one adjusted polishing pressure for the first zone.

Implementations may include one or more of the following features. The in-situ monitoring system may be an optical monitoring system configured to direct a light beam onto the first substrate. The overlying layer comprises GST, the light beam may include an infra-red component, and the measurements of intensity of the reflected light beam may be measurements of intensity of an infra-red component of the reflected light beam. The overlying layer may be copper, aluminum, tungsten, tantalum, titanium or cobolt, and the light beam may include a red component and the measurements of intensity of the reflected light beam may be measurements of intensity of the red component of the reflected light beam. Polishing may include polishing with a carrier head having a first chamber and a second chamber to apply independently adjustable pressures to the first zone and the second zone, respectively. The first zone may be an innermost zone, or the first zone may be an outermost zone, or the first zone may be a middle zone between an innermost zone and an outermost zone. Calculating the at least one adjusted pressure P1' may include calculating P1'=P1*G1*(T1/T2) wherein P1 is the first pressure, T1 is the first time, T2 is the second time, and G1 is the inverse of the ratio for the clearance time of the first zone of a substrate to the clearance time of the second zone of the substrate. Determining a time at which the underlying layer is exposed may include determining a time at which the sequence of measurements stabilizes. Determining a time at which the sequence of measurements stabilizes may include determining that a slope of a trace generated by the sequence of measurements remains within a predetermined range for a predetermined time period.

In another aspect, a computer-readable medium has stored thereon instructions, which, when executed by a processor, causes the processor to perform operations Implementations can include one or more of the following potential advantages. Dishing and erosion can be made more uniform across the substrate. Within-wafer non-uniformity (WIWNU) can be reduced. A polishing process can be adjusted to compensate for process drift over consumable life (e.g. polish head, pad, or slurry) so that the dishing and erosion is more uniform from substrate to substrate.

The details of one or more embodiments are set forth in the accompanying drawings and the description below. Other aspects, features and advantages will be apparent from the description and drawings, and from the claims.

DESCRIPTION OF DRAWINGS

Like reference symbols in the various drawings indicate like elements.

DETAILED DESCRIPTION

Figure 1:
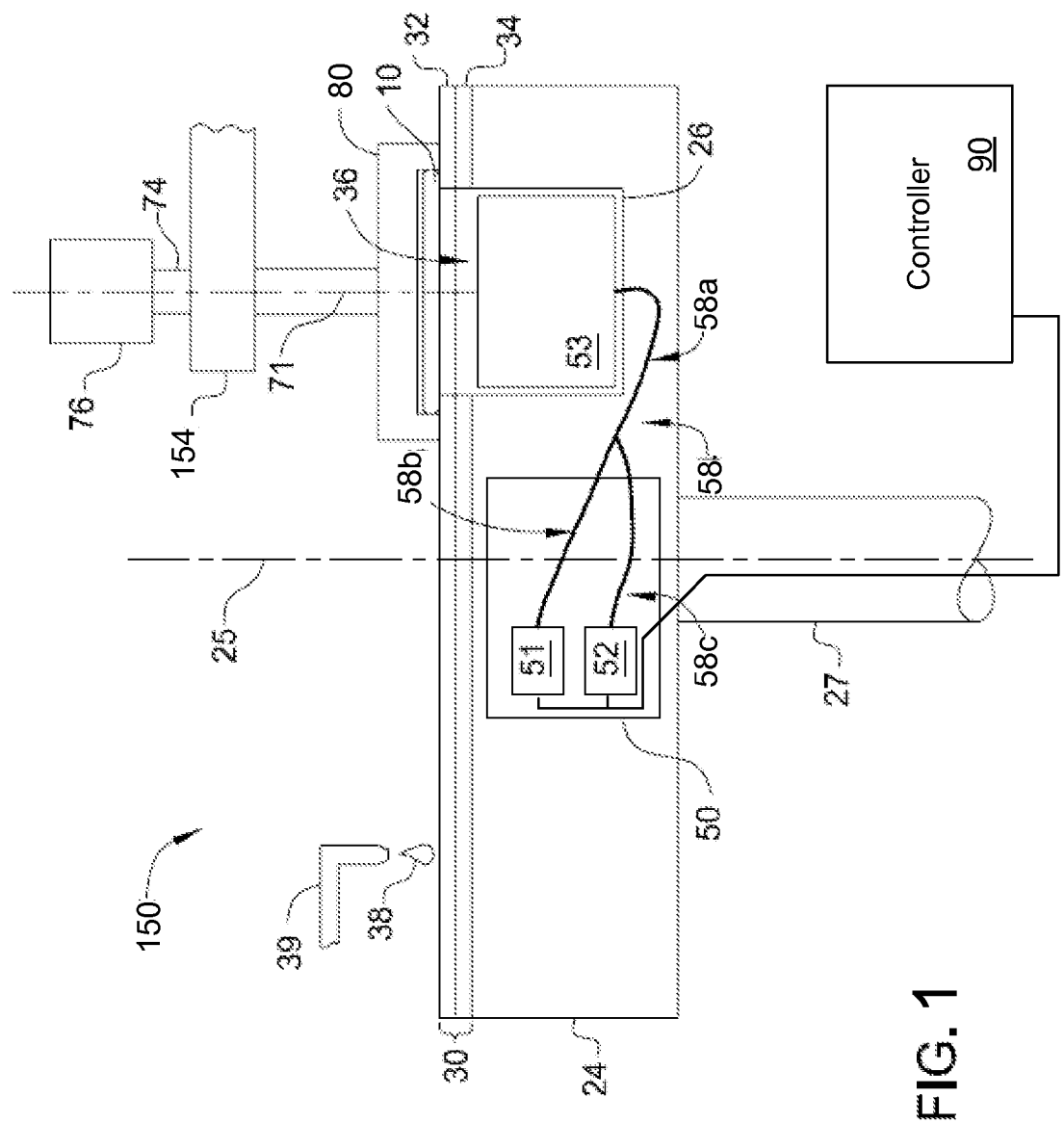
FIG. 1 shows a schematic cross-sectional view of a polishing station.

In some semiconductor chip fabrication processes an overlying layer, e.g., a metal such as copper, tungsten, aluminum, titanium, tantalum or cobolt, a semimetal, or an alloy of metal(s) and/or semimetal(s), e.g., GeSbTe (a ternary compound of germanium, antimony and tellurium, also known as GST), is deposited over a patterned underlying layer or layer structure, e.g., a stack of one or more other layers. The one or more other layers can include layers of dielectric material, e.g., a low-k material and/or a low-k cap material, or of barrier metal, e.g., tantalum nitride or titanium nitride. Often the overlying layer is polished until it is "cleared", i.e., until the top surface of the underlying layer or layer structure is exposed. Portions of the overlying layer may be left in trenches, holes, etc., provided by the pattern of the underlying layer or layer structure.

A problem with monitoring of polishing of the overlying layer is that for some materials, e.g., metals with high reflectivity, optical (e.g., spectrographic) monitoring of the substrate may not provide useful information regarding the thickness of the overlying layer during bulk polishing. Without being limited to any particular theory, at wavelengths typically used for optical monitoring the extinction coefficient of the material of the overlying layer may be sufficiently high that the reflectivity may not appreciably change as the thickness is reduced during bulk polishing. As such, optical monitoring may not be suitable for in-situ feedback control of polishing parameters during bulk polishing of some materials. Although the reflectivity of the overlying layer can change as it is cleared and the underlying layer is exposed, by the time such a change in optical behavior is detected, it can be too late for an in-situ adjustment of the polishing rate of the substrate being polished to improve the uniformity of clearing time across the substrate.

In addition, for some of these same materials, eddy current monitoring is not effective in detecting clearance of the overlying layer. For example, barrier metals, such as titanium nitride and tantalum nitride, cannot provide a good eddy current signal due to their intrinsic high resistivity. For other metals, e.g., copper, aluminum and tungsten, the eddy current sensor may not pick up a signal from the discontinuous metal films remaining on the substrate, and thus detection of clearance of the overlying layer may be unreliable.

However, for many processes the overlying layer has a different reflectivity than the underlying layer or layer structure. Without being limited to any particular theory, this may be because the overlying layer has a different, e.g., higher, extinction coefficient than the underlying layer. In such cases, the reflectivity or reflected spectrum from the substrate should change when the overlying layer clears and the underlying layer is exposed.

In general, it would be desirable to have the overlying layer clear completely (e.g., no discontinuous regions of the overlying layer coating the top surface of the underlying layer or layer structure) and at substantially the same time across the surface of the substrate. This can avoid overpolishing, improve throughput and reduce within-wafer nonuniformity (WIWNU). Unfortunately, as noted above, an unexpected problem is that even when different regions of a substrate are cleared at the same time, there can still be significant differences in the amount of dishing and erosion across the substrate.

A technique discussed below to improve uniformity of dishing is to deliberately introduce differences in clearance time, e.g., a preset ratio of polishing times, across the substrate to compensate for the differences in topology. This is performed in conjunction with optically detecting clearance of the overlying layer in multiple different regions of a first substrate. A pressure on at least one region of a subsequent second substrate is adjusted based on the times that clearance was detected in the first substrate such that clearance will occur closer to the preset ratio of times, than without such an adjustment.

While this technique can particularly address the problem described above, it is also generally applicable even if optical monitoring can provide useful information regarding the thickness of the overlying layer during bulk polishing. In this case, the technique can have other advantages, such as consistency of process control between different materials, or reduction of computational load (because detection of clearing may be less computationally intense than determination of thickness). Thus, the technique can be applicable to other semitransparent materials, e.g. semitransparent metals, e.g., GST. In particular, the technique is if there is a clear change in behavior of the reflectance trace as the layer is cleared.

FIG. 1 is a schematic cross-sectional view of a chemical mechanical polishing station 150 operable to polish the substrate 10. The polishing station 150 includes a rotatable disk-shaped platen 24, on which a polishing pad 30 is situated. The platen 24 is operable to rotate about an axis 25. For example, a motor (not shown) can turn a drive shaft 27 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

The polishing station 150 can include a combined slurry/rinse arm 39. During polishing, the arm 39 is operable to dispense slurry 38, e.g., a liquid with abrasive particles. Alternatively, the polishing station 22 includes a slurry port operable to dispense slurry onto polishing pad 30.

The polishing station 150 also includes the carrier head 80 that is operable to hold the substrate 10 against the polishing pad 30. The carrier head 80 is suspended from a support structure, for example, the carousel 154, and is connected by a carrier drive shaft 74 to a carrier head rotation motor 76 so that the carrier head can rotate about an axis 71. In addition, the carrier head 80 can oscillate laterally in a radial slot formed in the support structure. In operation, the platen 24 is rotated about its central axis 25, and the carrier head 80 is rotated about its central axis 71 and translated laterally across the top surface of the polishing pad 30.

Figure 2:
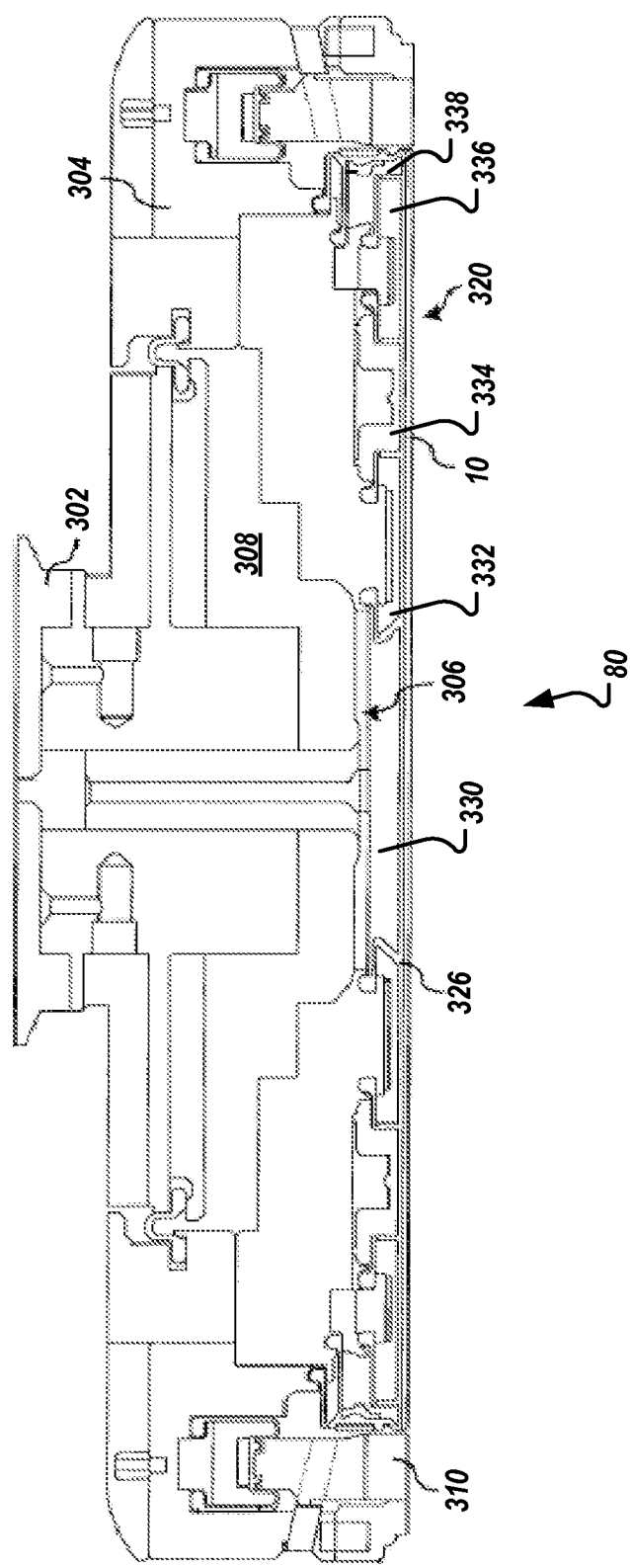
FIG. 2 shows a schematic cross-sectional view of a carrier head.
Figure 3B:
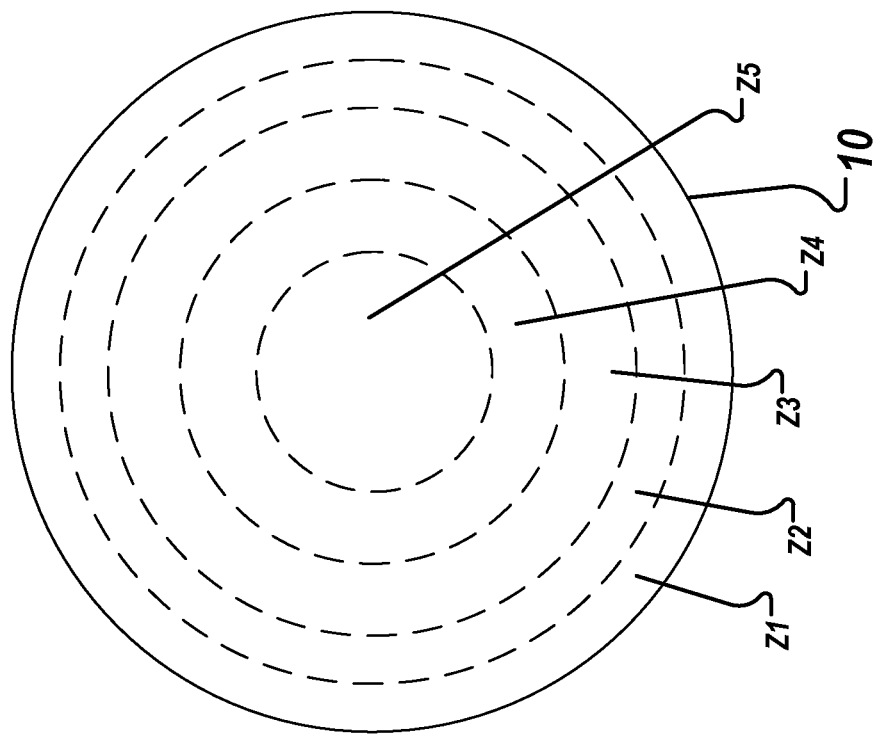
FIG. 3B shows concentric zones on a substrate.

Referring to FIG. 2, the carrier head 80 can include multiple chambers in order to apply independently controllable pressures to multiple regions, e.g., concentric regions, on the substrate. In one implementation, the carrier head 80 includes a housing 302, a base assembly 304, a gimbal mechanism 306 (which can be considered part of the base assembly 304), a loading chamber 308, a retaining ring 310, and a substrate backing assembly 320 which includes a flexible membrane 326 that defines multiple independently pressurizable chambers, such as an inner chamber 330, a middle chambers 332, 334, 336, and an outer chamber 338. These chambers control the pressure on concentric regions of the flexible membrane, thus providing independent pressure control on concentric portions of the substrate 10. In some implementations, the carrier head 80 includes five chambers and a pressure regulator for each of the chambers. For example, referring to FIG. 3B, the five chambers 330, 332, 334, 336, and 338 can control the pressure applied to five concentric zones Z1, Z2, Z3, Z4 and Z5 on the substrate 10. Of course there could be more or fewer chambers and zones (but at least two).

Returning to FIG. 1, the polishing station 150 also includes an optical monitoring system, which can be used to determine a polishing endpoint as discussed below. The optical monitoring system includes a light source 51 and a light detector 52. Light passes from the light source 51, through the polishing pad 30, impinges and is reflected from the substrate 10 back through the polishing pad, and travels to the light detector 52.

Optical access through the polishing pad 30 is provided by including an aperture (i.e., a hole that runs through the pad) or a solid window 36. The solid window can be secured to the polishing pad 30, although in some implementations the solid window 36 can be supported on the platen 24 and project into an aperture in the polishing pad 30. In some implementations the solid window 36 is secured in the polishing pad 30 and is a polyurethane window. The polishing pad 30 is usually placed on the platen 24 so that the aperture or window overlies an optical head 53 situated in a recess 26 in the top surface of the platen 24. The optical head 53 consequently has optical access through the aperture or window to a substrate being polished.

A bifurcated optical cable 58 can be used to transmit light from the light source 51 to the window 36 and back from the window 36 to the light detector 52. The bifurcated optical cable 58 can include a "trunk" 58a and two "branches" 58b and 58c.

As mentioned above, the platen 24 includes the recess 26, in which the optical head 53 is situated. The optical head 53 holds one end of the trunk 58a of the bifurcated fiber cable 58, which is configured to convey light to and from a substrate surface being polished. The optical head 53 can include one or more lenses or a window overlying the end of the bifurcated fiber cable 58. Alternatively, the optical head 53 can merely hold the end of the trunk 58a adjacent the window in the polishing pad. The optical head 53 can be removed from the recess 26 as required, for example, to effect preventive or corrective maintenance.

The platen 24 includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 27 to a controller 90 for the optical monitoring system. Similarly, the light source can be turned on or off in response to control commands in digital electronic signals that pass from the controller 90 through the rotary coupler to the module 50.

The in-situ monitoring module can also hold the respective ends of the branch portions 59b and 58c of the bifurcated optical fiber cable 58. The light source is operable to transmit light, which is conveyed through the branch 58b and out the end of the trunk 58a located in the optical head 53, and which impinges on a substrate being polished. Light reflected from the substrate is received at the end of the trunk 58a located in the optical head 53 and conveyed through the branch 58c to the light detector 52.

The polishing station 150 can include a mechanism, e.g., as part of the optical head 53, that is operable to adjust the distance between the end of the bifurcated fiber cable 58 and the bottom surface of the polishing pad window 36. Alternatively, the proximate end of the bifurcated fiber cable is embedded in the window 36.

If the overlying layer is GST, then the light source 51 can be selected to emit light in the near infrared range, e.g., monochromatic light, e.g., light with a wavelength of about 1.3 microns. Alternatively, the light source 51 can be configured to emit light with a narrow bandwidth, e.g. around 1.3 microns. Alternatively, the light source 51 can be configured to emit light with a wide bandwidth in the near infrared range, e.g., including light around 1.3 microns, and the detector 52 can be configured to detect light with a narrower bandwidth, e.g. around 1.3 microns, or the detector can be a spectrometer configured to use intensity measurements from the near infrared range, e.g. around 1.3 microns. In some implementations, the light source 44 emits light having wavelengths in the 2-5 microns range, suitable for GST thickness measurements. In some implementations, the light source 44 emits light having wavelengths in the 10 micron range, suitable for GST structural phase measurements.

If the overlying layer is another metal, e.g., copper, tungsten, aluminum, titanium or tantalum, or a barrier metal, e.g., titanium nitride or tantalum nitride, then the light source 51 can be selected to emit light in the visible range, e.g., red light. The light source can emit monochromatic light, e.g., light with a wavelength between about 650-670 nm. Alternatively, the light source 51 can be configured to emit light with a narrow bandwidth, e.g. around 650-670 nm, or with a wide bandwidth in the visible light range. The detector 52 can be configured to detect a total intensity of the reflected light beam across some or all of the visible light range, e.g., the detector can be a simple photodiode that operates in the visible light range or be a spectrometer configured to sum intensities across a wavelength band, or the detector can be configured to detect an intensity of the reflected light beam at substantially a single wavelength, e.g., the detector can be a photodiode that operates at a substantially a single wavelength, or a spectrometer configured to use the intensity measurement of a single wavelength from the detected spectrum. The detector 52 can be sensitive to red light, e.g., a wavelength between about 650-670 nm.

Figure 3A:
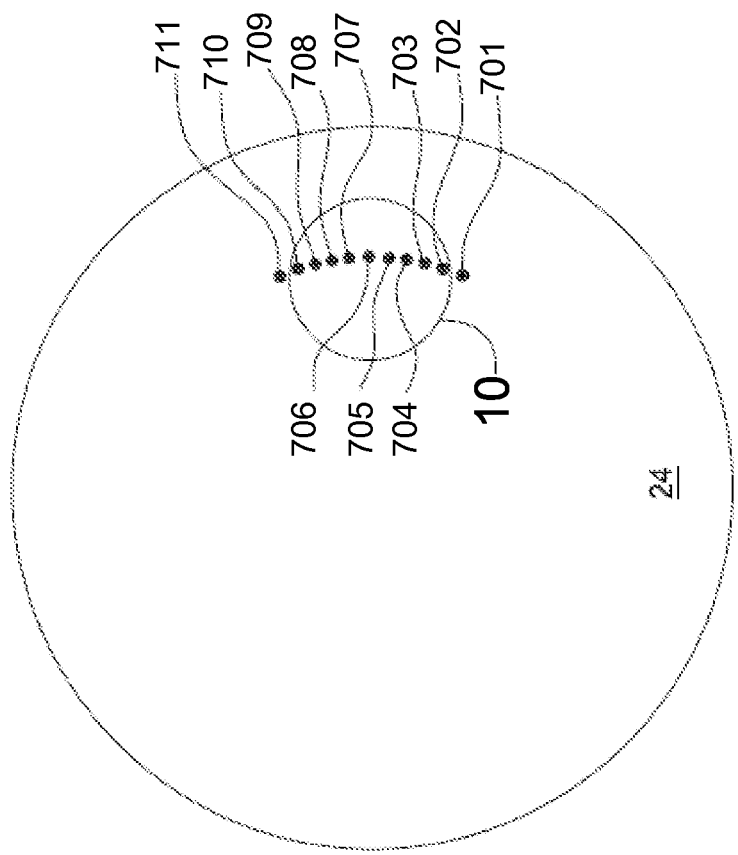
FIG. 3A shows an overhead view of a substrate on a platen and shows locations where measurements are taken.

The light source 51 and light detector 52 are connected to the controller 90 to control their operation and to receive their signals. With respect to control, the controller 90 can, for example, synchronize activation of the light source 51 with the rotation of the platen 24. As shown in FIG. 3A, the controller 90 can cause the light source 51 to emit a series of flashes starting just before and ending just after the substrate 10 passes over the in-situ monitoring module. (Each of points 701-711 depicted represents a location where light from the in-situ monitoring module impinged and reflected off.) Alternatively, the controller 90 can cause the light source 51 to emit light continuously starting just before and ending just after the substrate 10 passes over the in-situ monitoring module. Although not shown, each time the substrate 10 passes over the monitoring module, the alignment of the substrate 10 with the monitoring module can be different than in the previous pass. Over one rotation of the substrate 10, intensity measurements are obtained from different angular locations on the substrate 10, as well as different radial locations. That is, some intensity measurements are obtained from locations closer to the center of the substrate 10 and some are closer to the edge. The controller can sort the intensity measurements from the substrate 10 into groups corresponding to the concentric radial zones, e.g., by calculating the distance between the location of the intensity measurement and the center of the substrate. The radial zones can correspond to the different controllable zones on the carrier head 80. For example, referring to FIG. 3B, the intensity measurements can be sorted into groups corresponding to concentric radial zones Z1, Z2, Z3, Z4 and Z5 on the substrate 10. Three, four, five, six, seven or more zones can be defined on the surface of the substrate 10.

With respect to receiving signals, the controller 90 can receive, for example, a signal with the intensity of light received by the light detector 52. The controller 90 can process the signal to when the underlying layer was exposed, and use this information to adjust the polishing parameters, e.g., pressure in one of the carrier head chambers, in order to improve dishing uniformity.

Figure 4:
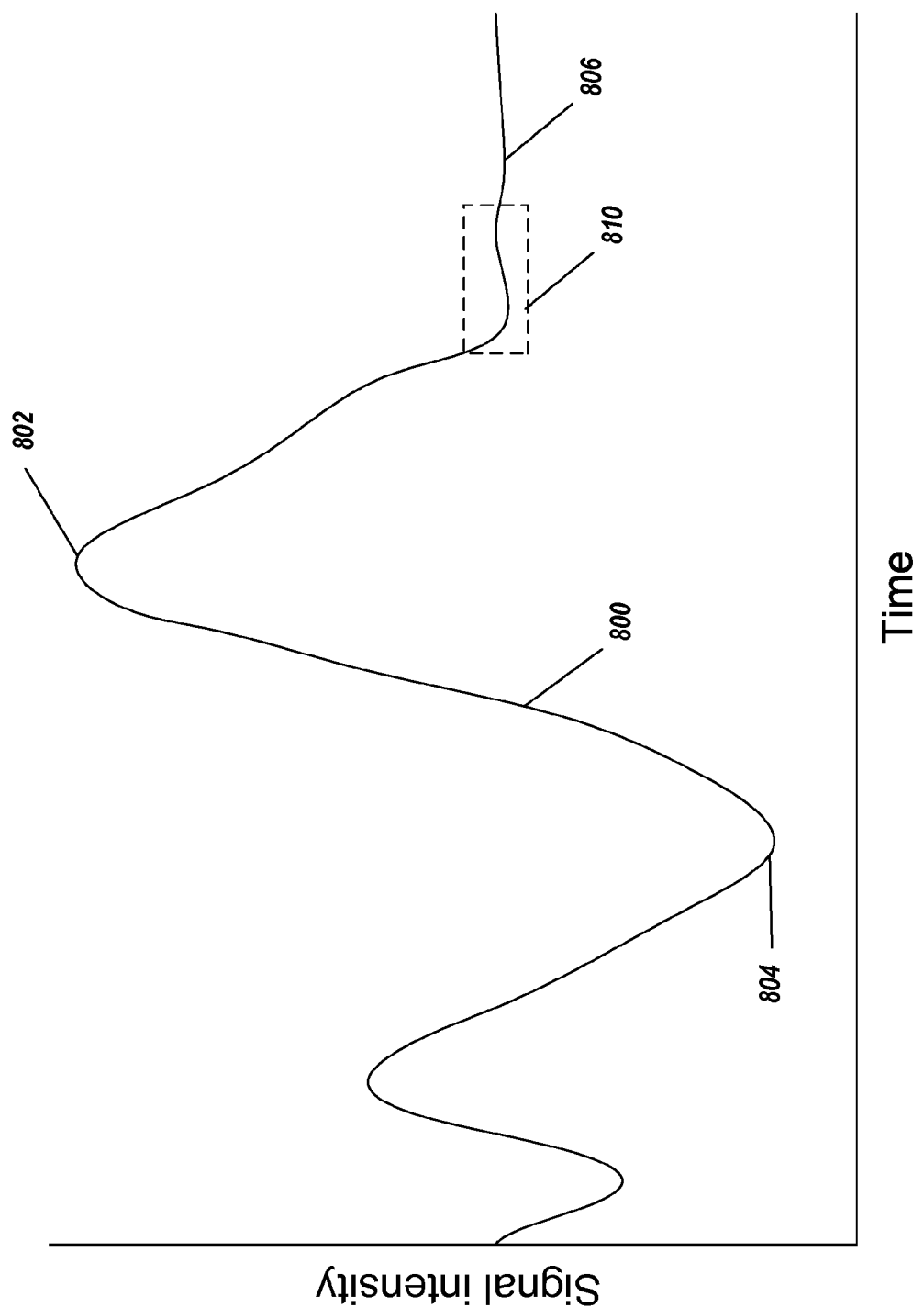
FIG. 4 shows a schematic exemplary graph of signal intensity as a function of time for a substrate being polished that includes a layer of GST.

Referring to FIG. 4, for a given radial zone, the sequence of measurements from a series of sweeps of the sensor generates an intensity trace 800 which is a function of time or number of platen rotations. As illustrated, for polishing of a GST layer, the intensity of light reflected from the substrate 10 evolves as polishing progresses, passing through one or more peaks 802 and/or valleys 804, and then stabilizing at a plateau 806. While the intensity trace 800 shown in FIG. 4 is merely illustrative, and have many other shapes, intensity traces generated during polishing of GST will have a common feature in that after an initial period of variation, the intensity trace stabilizes at a plateau 806.

Without being limited to any particular theory, as the GST layer is being polished, its thickness changes. The change in thickness causes a variation in the interference between the light reflected from the surface of the GST layer and any underlying layer, resulting in variations in the intensity of the reflected light. However, once the layer underlying the GST layer is exposed, the signal is primarily due to reflection from the underlying layer, and the reflected signal intensity stabilizes. By detecting when the intensity trace stabilizes, the controller can determine the time at which the GST layer was cleared and the underlying layer was exposed. Detection of stabilization of the intensity trace can include detecting whether the slope of the trace remains within a predetermined range (near zero slope) for some threshold time period 810. Detection of stabilization of the intensity trace can also include detecting whether the magnitude of the trace remains within a range (set relative to the magnitude at the beginning of the time period) for the threshold time period.

Figure 5:
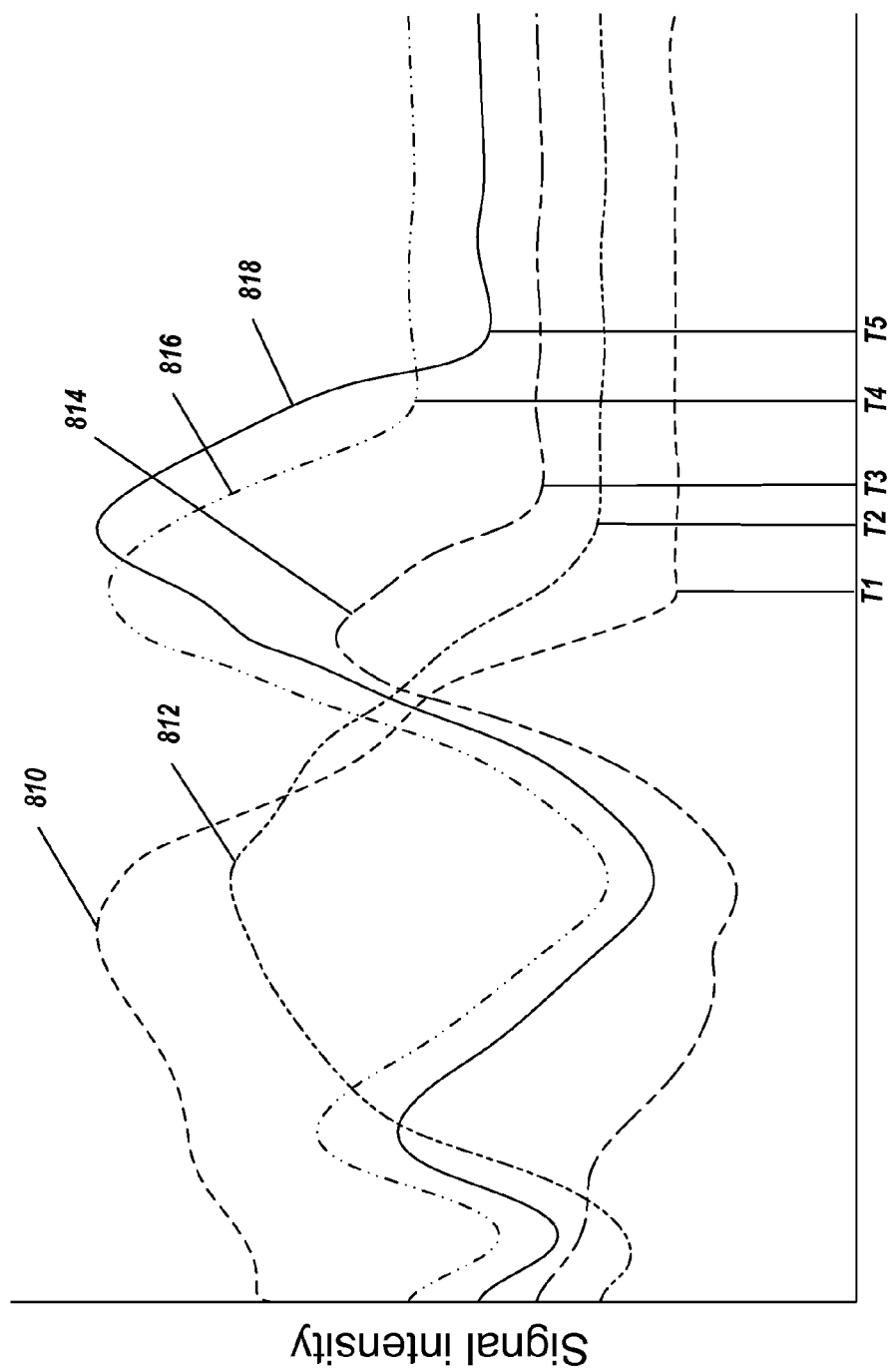
FIG. 5 shows a schematic exemplary graph of signal intensities from multiple regions of a substrate being polished that includes a layer of GST.

As noted above, the intensity measurements from the optical sensor can be sorted into different radial zones. This permits creation of a separate intensity trace for each radial zone. For example, as shown in FIG. 5, if the intensity traces are divided into five radial zones, then five corresponding traces, e.g., traces 810, 812, 814, 816 and 818, can be generated.

Figure 6:
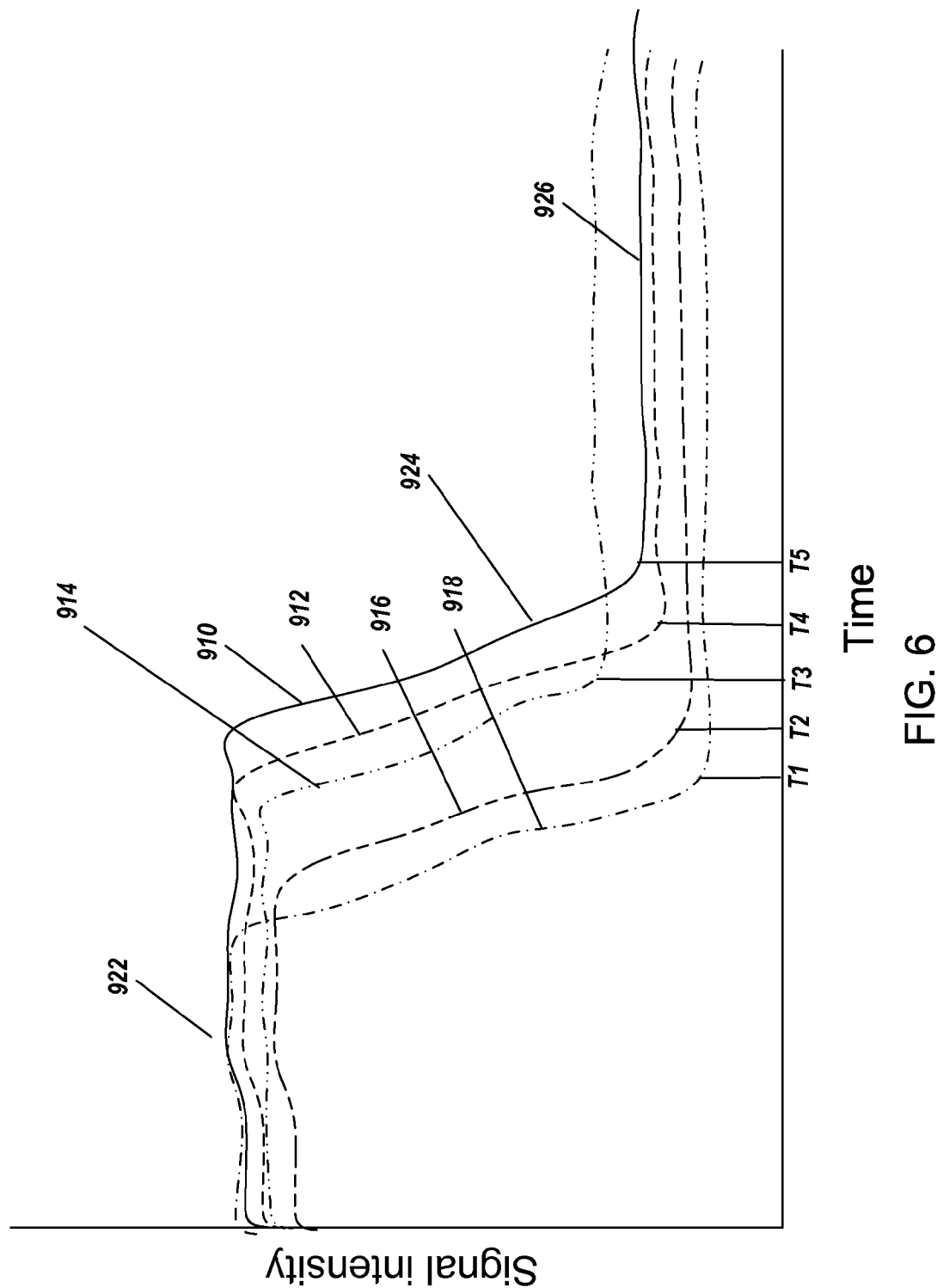
FIG. 6 shows a schematic exemplary graph of signal intensities from multiple regions of a substrate being polished that includes a layer of metal.

Referring to FIG. 6, for polishing of an overlying layer that is a reflective material, e.g., a metal, such as copper, tungsten, aluminum, titanium or tantalum, the sequence of measurements from a series of sweeps of the sensor generates multiple intensity traces which are a function of time or number of platen rotations. For example, if the intensity traces are divided into five radial zones, then five corresponding traces, e.g., traces 910, 912, 914, 916 and 918, can be generated. In general, for each trace, the intensity remains relatively stable in an initial plateau 922. However, as the overlying layer clears and the underlying layer is exposed, the intensity trace has a sharp drop 924. Once the top surface of the underlying layer is completely exposed, the intensity trace stabilizes in a second plateau 926. By detecting when the intensity trace drops and then stabilizes, the controller can determine the time at which the reflective overlying layer was cleared and the underlying layer was exposed in each region of the substrate.

Figure 7:
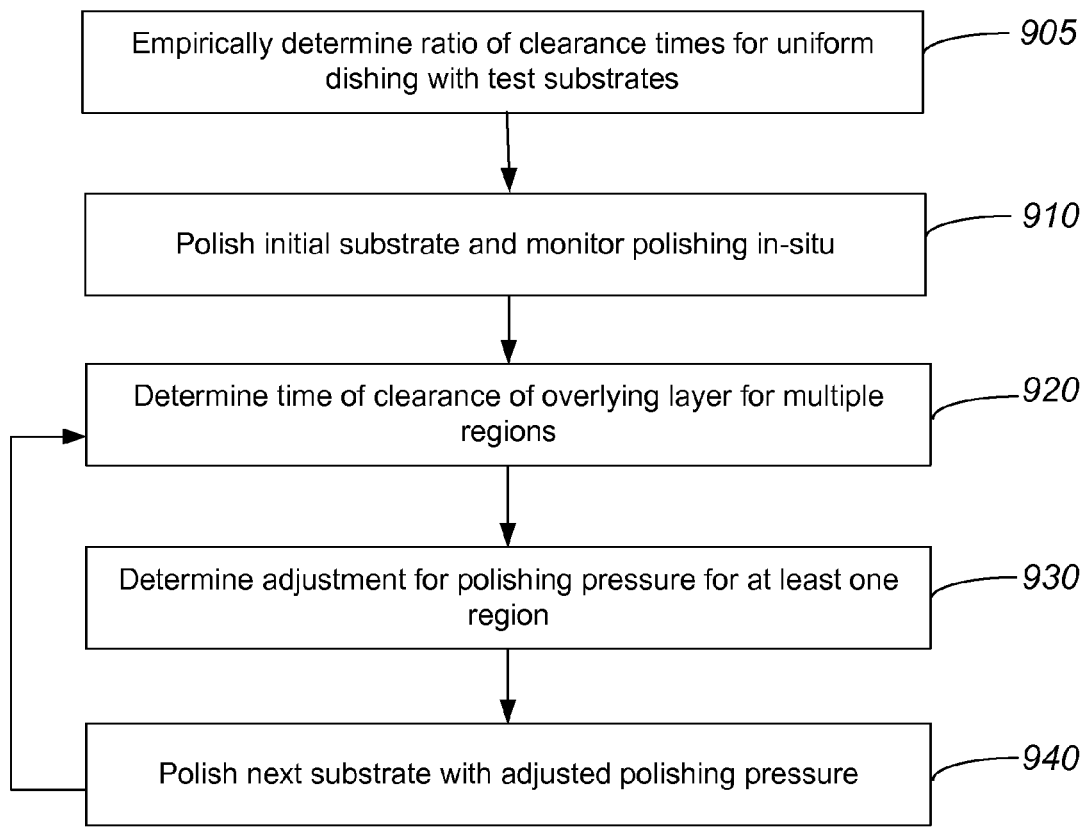
FIG. 7 shows a flow chart for a polishing process.

A method of polishing will be explained with reference to FIG. 7. Prior to polishing of device substrates, a desired ratio of clearance times for different zones of the substrate can be determined that will provide improved uniformity of dishing (step 905). For example, multiple test substrates can be polished using a carrier head with multiple controllable zones and using a default pressure for each zone. During polishing, the overlying layer is monitored in-situ using the optical monitoring system, and the clearance time is detected for each zone. Each substrate can be polished using a different pressure or different polishing time. After each substrate is polished, the dishing can be measured in the different zones, e.g., using a stand-alone metrology station configured for measurement of dishing. From this collected data, a desired ratio of clearance times that will provide improved uniformity of dishing can be calculated. This desired ratio can be considered a predetermined value in that it is determined prior to polishing of the device substrates.

Figure 8:
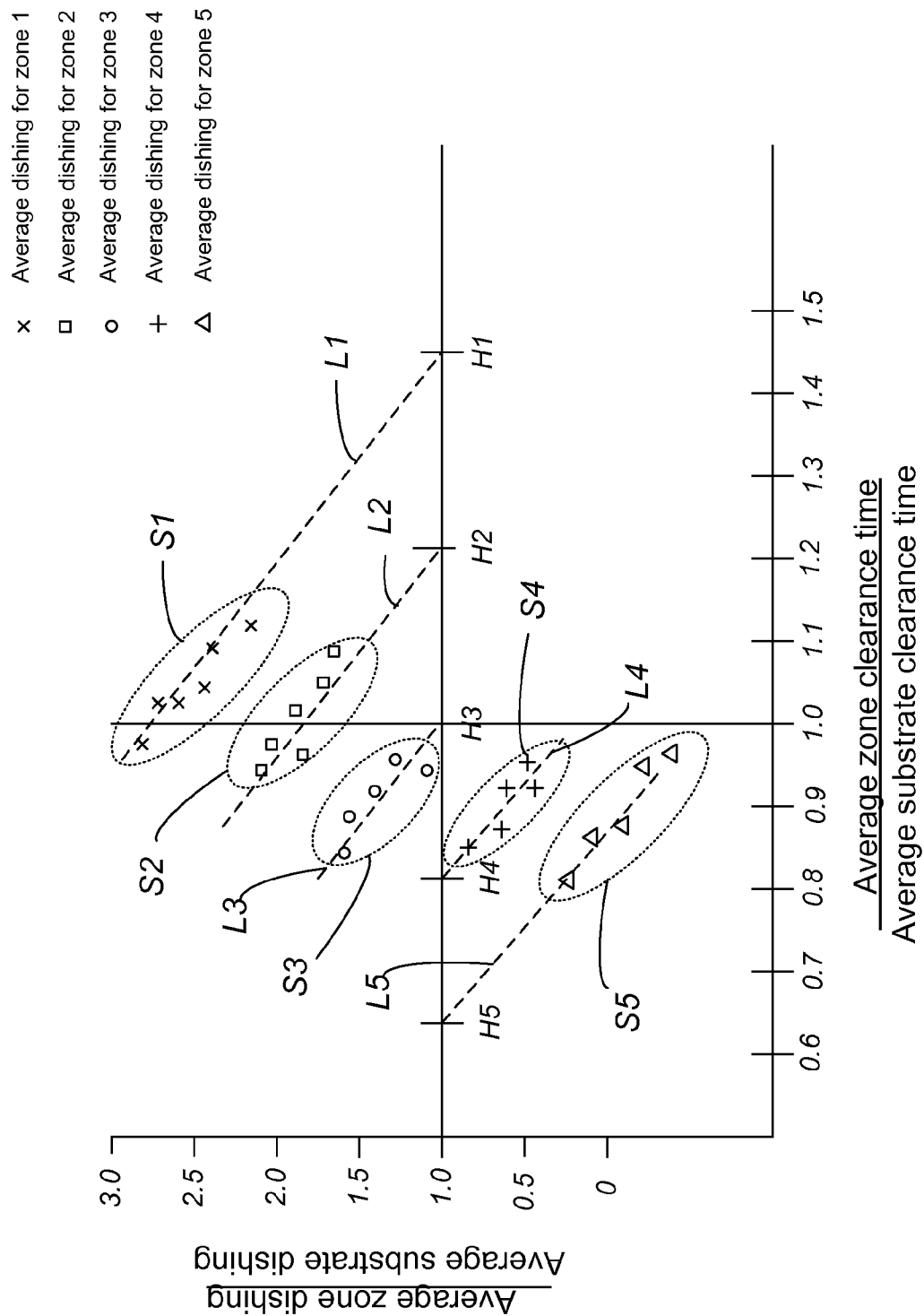
FIG. 8 is an exemplary scatter plot used to generate gain ratios.

For example, FIG. 8 illustrates a scatter plot of (zone clearance time/average substrate clearance time) on the x-axis and (average zone dishing/average substrate dishing) on the y-axis for different zones of the substrate. For each test substrate, the clearance time for the zone (or the average clearance time for the zone if multiple regions within a zone are monitored) is calculated, and the average clearance time for the entire substrate is calculated (based on clearance times measured for individual zones), and the ratio gives the x-position of the point on the plot. In addition, the average dishing within a zone is calculated (from the measurements from the stand-alone metrology station), and the average dishing for the entire substrate is calculated (again from the measurements from the stand-alone metrology station), and the ratio gives the y-position of the point on the plot. In the example of FIG. 8, there are five set of points, S1, S2, S3, S4, S5, corresponding to the five zone Z1, Z2, Z3, Z4, Z5.

A linear function can be fit to each set of points, e.g., line L1 is fit to the set of points S1, line L2 is fit to the set of points S2, etc. The intersection of each linear function with the y=1 axis (i.e., where the average dishing for the zone will equal the average dishing for the substrate), provides a desired clearance time ratio for the associated zone. For example, line L1 intersects y=1 at H1, line L2 intersects y=1 at H2, etc. Assuming a simple Prestonian model for polishing, if the pressure applied to a zone is modified according to the inverse of the desired clearance time ratio (e.g., 1/H1), then the ratio of clearance time for that zone to the average clearance time for the substrate should be H1, and the average dishing for that zone should equal the average dishing for the substrate. In short, by adjusting the pressures applied to the zones to drive the clearance times of the different zones to provide these desired ratios, the uniformity of the dishing across the substrate should be improved. A pressure gain G1, G2, G3, G4, G5 for each zone can be calculated from the inverse of the desired clearance time ratios, i.e., G1=1/H1, G2=1/H2, etc.

Once determined empirically, the desired ratios can be stored in the controller. However, it may be necessary to generate new ratios for any particular combination of substrate pattern and polishing consumables.

Returning to FIG. 7, a first substrate with an overlying layer is polished using a carrier head with multiple controllable zones and using a default pressure for each zone (step 910). For example, if there are five zones, then pressures P1, P2, P3, P4 and P5 can be applied by the five chambers of the carrier head to the respective zones Z1, Z2, Z3, Z4 and Z5 (see FIG. 3B) on the substrate. During polishing, the overlying layer is monitored in-situ using the optical monitoring system. Intensity measurements from the monitoring system are sorted into groups corresponding to radial zones, and for each zone, the time that the overlying layer is cleared to expose the underlying layer is calculated based on the measurements from the corresponding group (step 920). For example, referring to FIG. 5, five intensity traces 810, 812, 814, 816 and 818, can be generated, with resulting clearance times T1, T2, T3, T4 and T5, for the respective zones Z1, Z2, Z3, Z4 and Z5 (see FIG. 3B). For example, referring to FIG. 6, five intensity traces 910, 912, 914, 916 and 918, can be generated, with resulting clearance times T1, T2, T3, T4 and T5, for the respective zones Z1, Z2, Z3, Z4 and Z5 (see FIG. 3B).

Returning to FIG. 7, next, adjusted polishing pressures are calculated for at least one of the controllable zones of the carrier head (step 930). Pressures can be calculated under a simple Prestonian model to adjust the polishing rates to cause each zone to clear at times that satisfy the previously determined desired ratio. One zone, e.g., the center zone Z3, can be selected as the reference zone. For each other zone, an adjusted pressure is calculated by multiplying the default pressure by the ratio of the polishing time of the zone being adjusted to the polishing time of the reference zone, and multiplied by the pressure gain (i.e., the inverse of the desired clearance time ratio for the zone). For example, adjusted pressures P1', P2', P4' and P5' for zones Z1, Z2, Z4, Z5 can be calculated as P1'=G1*P1*(T1/T3), P2'=G2*P2*(T2/T3), P4'=G4*P4*(T4/T3) and P5'=G5*P5*(T5/T3). Alternatively, the outermost zone, innermost zone, or another zone could be selected as the reference zone. A subsequent substrate is then polished with the adjusted polishing pressures (step 940).

Polishing of the subsequent substrate can monitored with the optical monitoring system), a new set of clearance times T1, T2, T3, T4 and T5, for the respective zones Z1, Z2, Z3, Z4 and Z5 can be determined (step 910), and a new set of adjusted pressures calculated with the previously calculated adjusted pressures being used as the new default pressures (step 920), and another substrate polished with the new set of adjusted pressures. More generally, the system can perform an iterative feedback method, in which, for each next substrate to be polished, the clearance times and pressures for the prior substrate are used to calculate adjusted pressures for the next substrate.

In addition, it is possible that adjusted pressures could be calculated based on a weighted running average of clearance times and/or pressures for multiple prior substrates, rather than only the immediately prior substrate. For example, the pressures could be calculated according to the following equations:

$$R_{Zi}[n] = G_{Zi} * \frac{T_{Zi}[n]}{T_{Zref}[n]}$$

where $R_{Zi}[n]$ is the feed forward ratio for zone Zi from substrate n, $G_{Zi}$ is the stored desired pressure gain for the zone Zi (e.g., the values G1, G2, etc. above, which can be determined from the inverse of the desired clearance time ratios H1, H2, etc.), $T_{Zi}[n]$ is the clearance time for zone Zi of substrate n, and $T_{Zref}[n]$ is the clearance time for the reference zone for substrate n.

An accumulated average can be calculated as $$M_{Zi}[n] = M_{Zi}[n-1] * \Sigma_{k=1}^{j} R_{Zi}[n-k]/j$$

where $M_{Zi}[n]$ is an accumulative multiplier to be used for the zone Zi after substrate n is polished and j is a moving average value for the feed forward parameter.

The pressure for a particular zone of a subsequent substrate can be calculated as $$P_{Zi}[n+1] = P_{Zi}[0] * M_{Zi}[n]$$

where $P_{Zi}[n+1]$ is the pressure for zone Zi of the subsequent substrate n+1, and $P_{Zi}[0]$ is the initial default pressure from a polishing recipe.

Although the discussion above focuses on detection of clearing using optical techniques, the process may be applicable to other in-situ monitoring techniques that can detect clearance of the overlying layer, such as local surface friction sensing (e.g., as described in U.S. Pat. No. 7,513, 818, incorporated by reference), or eddy current monitoring (assuming that accuracy of the eddy current monitoring technique to detect clearance is sufficiently sensitive).

It should be understood that when storing the desired ratio for a clearance time of a first zone of a substrate to a clearance time of a second zone of the substrate, the desired ratio could be stored as the pressure ratio. For example, the clearance time ratios could be calculated as described above, but the pressure ratios calculated as the inverse of the desired clearance time ratios could be what is stored.

Implementations and all of the functional operations described in this specification can be implemented in digital electronic circuitry, or in computer software, firmware, or hardware, including the structural means disclosed in this specification and structural equivalents thereof, or in combinations of them. Implementations described herein can be implemented as one or more computer program products, i.e., one or more computer programs tangibly embodied in an information carrier, e.g., in a machine readable storage device or matters capable of effecting a propagated signal, for execution by, or to control the operation of, data processing apparatus, e.g., a programmable processor, a computer, or multiple processors or computers.

A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier head, or both can move to provide relative motion between the polishing surface and the wafer. For example, the platen may orbit rather than rotate. The polishing pad can be a circular (or some other shape) pad secured to the platen. Some aspects of the endpoint detection system may be applicable to linear polishing systems (e.g., where the polishing pad is a continuous or a reel-to-reel belt that moves linearly). The polishing layer can be a standard (for example, polyurethane with or without fillers) polishing material, a soft material, or a fixed-abrasive material. Terms of relative positioning are used; it should be understood that the polishing surface and wafer can be held in a vertical orientation or some other orientations.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

What is claimed is:

1. A method of controlling polishing, comprising:
   prior to polishing of a first substrate, storing a desired ratio, the desired ratio representing a desired ratio determined prior to polishing of a substrate for a clearance time of a first zone of the substrate to a clearance time of a second zone of the substrate, and wherein the desired ratio indicates that the clearance time of the first zone differs from the clearance time of the second zone;

polishing the first substrate, wherein the first substrate has an overlying layer on an underlying layer or layer structure;

during polishing of the first substrate, monitoring the overlying layer with an in-situ monitoring system and generating a sequence of measurements from the in-situ monitoring system;

sorting the measurements into a first group associated with the first zone of the first substrate and a second group associated with the second zone on the first substrate;

determining a first time at which the overlying layer is cleared from the first zone on the first substrate based on the measurements from the first group;

determining a second time at which the overlying layer is cleared from the second zone on the first substrate based on the measurements from the second group;

calculating at least one adjusted polishing pressure for the first zone based on a first pressure applied in the first zone during polishing the first substrate, the first time, the second time, and the desired ratio; and polishing a second substrate using the at least one adjusted polishing pressure for the first zone, the adjusted polishing pressure being such that a ratio of a clearance time of the first zone of the second substrate to a clearance time of the second zone of the second substrate is closer to the desired ratio than without such adjustment, and such that the desired ratio provides a difference between the clearance time of the first zone of the second substrate and the clearance time of the second zone of the second substrate.

2. The method of claim 1, wherein the in-situ monitoring system comprises an optical monitoring system configured to direct a light beam onto the first substrate.

3. The method of claim 1, wherein the overlying layer comprises GST.

4. The method of claim 3, wherein the light beam includes an infra-red component and the measurements are measurements of intensity of the infra-red component of a reflected light beam.

5. The method of claim 1, wherein the overlying layer is copper, aluminum, tungsten, tantalum, titanium or cobolt.

6. The method of claim 5, wherein the light beam includes a red component and the measurements are measurements of intensity of the red component of a reflected light beam.

7. The method of claim 1, wherein polishing comprises polishing with a carrier head having a first chamber and a second chamber to apply independently adjustable pressures to the first zone and the second zone, respectively.

8. The method of claim 1, wherein the first zone comprises an innermost zone.

9. The method of claim 1, wherein the first zone comprises an outermost zone.

10. The method of claim 1, wherein the first zone comprises a middle zone between an innermost zone and an outermost zone.

11. A non-transitory computer program product, tangibly embodied in a computer readable medium, comprising instructions to cause a processor to:

prior to polishing of a first substrate store a desired ratio, the desired ratio representing a desired ratio determined prior to polishing of a substrate for a clearance time of a first zone of the substrate to a clearance time of a second zone of the substrate, and wherein the desired ratio indicates that the clearance time of the first zone differs from the clearance time of the second zone;

cause a polishing system to polish the first substrate, wherein the first substrate has an overlying layer on an underlying layer or layer structure;

receive, during polishing of the first substrate, a sequence of measurements of the first substrate from an in-situ monitoring system;

sort the measurements into a first group associated with the first zone of the first substrate and a second group associated with the second zone on the first substrate;

determine a first time at which the overlying layer is cleared from the first zone on the first substrate based on the measurements from the first group;

determine a second time at which the overlying layer is cleared from the second zone on the first substrate based on the measurements from the second group;

calculate at least one adjusted polishing pressure for the first zone based on a first pressure applied in the first zone during polishing the first substrate, the first time, the second time, and the desired ratio; and cause the polishing system to polish a second substrate using the at least one adjusted polishing pressure for the first zone, the adjusted polishing pressure being such that a ratio of a clearance time of the first zone of the second substrate to a clearance time of the second zone of the second substrate is closer to the desired ratio than without such adjustment, and such that the desired ratio provides a difference between the clearance time of the first zone of the second substrate and the clearance time of the second zone of the second substrate.

12. The computer program product of claim 11, wherein the instructions to calculate the at least one adjusted pressure $P1'$ comprise instructions to calculate $P1'$ as $P1*G1*(T1/T2)$ wherein $P1$ is the first pressure, $T1$ is the first time, $T2$ is the second time, and $G1$ is the inverse of the ratio for the clearance time of the first zone of a substrate to the clearance time of the second zone of the substrate.

13. The computer program product of claim 11, wherein the instructions to determine the first time comprise instructions to determine a time at which a first sequence of measurements stabilizes, the first sequence of measurements comprising measurements from the first group.

14. The computer program product of claim 13, wherein the instructions to determine the time at which the first sequence of measurements stabilizes includes determining that a slope of a trace generated by the first sequence of measurements remains within a predetermined range for a predetermined time period.

15. The computer program product of claim 11, wherein the instructions to determine the second time comprise instructions to determine a time at which a second sequence of measurements stabilizes, the second sequence of measurements comprising measurements from the second group.

16. The computer program product of claim 15, wherein the instructions to determine the time at which the second sequence of measurements stabilizes includes determining that a slope of a trace generated by the second sequence of measurements remains within a predetermined range for a predetermined time period.

17. The computer program product of claim 11, wherein the instructions to calculate the at least one adjusted pressure comprise instructions to calculate a weighted running average of clearing times of zones of prior substrates.

18. The computer program product of claim 11, wherein the instructions to store the desired ratio comprise instructions to store an inverse of the ratio of the clearance time of the first zone of the substrate to the clearance time of the second zone of the substrate.

19. The computer program product of claim 11, comprising instructions to store a second desired ratio, sort the measurements into a third group associated with a third zone of the substrate, determine a third time at which the overlying layer is cleared based on the measurements from the third group, calculate at least another adjusted polishing pressure for the third zone based on a third pressure applied in the third zone during polishing the first substrate, the third time, the second time, and the second desired ratio, and cause the polishing system to polish the second substrate using the at least another adjusted polishing pressure for the third zone.

* * * * *